United States Patent [19]
Sin

[11] Patent Number: 5,962,882
[45] Date of Patent: Oct. 5, 1999

[54] CHARGE COUPLED DEVICES INCLUDING BURIED TRANSMISSION GATES

[75] Inventor: Jong-Cheol Sin, Suwon, Rep. of Korea

[73] Assignee: Samsung Electronics Co., Ltd., Rep. of Korea

[21] Appl. No.: 08/847,996

[22] Filed: Apr. 21, 1997

[30] Foreign Application Priority Data

Jul. 18, 1996 [KR] Rep. of Korea ....................... 96-29039

[51] Int. Cl.$^6$ ........................ H01L 27/148; H01L 29/768
[52] U.S. Cl. ........................ 257/222; 257/223; 257/232; 257/233; 257/234
[58] Field of Search ................... 257/231, 232, 257/233, 234, 222, 223

[56] References Cited

U.S. PATENT DOCUMENTS

| | | | |
|---|---|---|---|
| 5,471,246 | 11/1995 | Nishima | 348/322 |
| 5,581,099 | 12/1996 | Kusaka et al. | 257/222 |
| 5,619,049 | 4/1997 | Kim | 257/223 |
| 5,668,390 | 9/1997 | Morimoto | 257/232 |
| 5,828,091 | 10/1998 | Kawai | 257/218 |

OTHER PUBLICATIONS

Ozaki et al., A High–Packing Density Pixel With Punchthrough Read–Out Method For An HDTV Interline CCD, IEEE Transactions On Electron Devices, vol. 41, No. 7, Jul. 1994, pp. 1128–1135.

*Primary Examiner*—William Mintel
*Attorney, Agent, or Firm*—Myers Bigel Sibley & Sajovec

[57] ABSTRACT

A charge coupled device includes a substrate, a photoelectric conversion region, a hole accumulation region, a vertical charge coupled region, and a buried transmission gate region. The substrate includes a surface with a light receiving region and a charge transmission region. The photoelectric conversion region is provided in a substrate beneath the light receiving and charge transmission regions, and the photoelectric conversion region generates a photoelectric signal responsive to light received at the light receiving region of the substrate surface. The hole accumulation region is provided in the substrate between the photoelectric conversion region and the light receiving region of the substrate surface. The vertical charge coupled region is provided in the substrate between the photoelectric conversion region and the charge transmission region of the substrate surface. The buried transmission gate region is provided between the vertical charge coupled region and the photoelectric conversion region. The buried transmission gate region transfers the photoelectric signal from the photoelectric conversion region to a portion of the vertical charge coupled region opposite the substrate surface. Related methods are also disclosed.

8 Claims, 4 Drawing Sheets

CHARGE COUPLED DEVICES INCLUDING BURIED TRANSMISSION GATES

FIELD OF THE INVENTION

The present invention relates to the field of electronics and more particularly to charge coupled devices.

BACKGROUND OF THE INVENTION

Charge coupled solid state imaging devices can be used to produce video images. The resolution of such an image can be increased by reducing the pixel size of such a device thus increasing the number of pixels per unit area. The reduction of the pixel size, however, may result in the following problems. First, it may be difficult to maintain the charge handling capacity as the size of a vertical charge coupled device (CCD) is reduced. Second, an image smear may increase as the distance between the photodiode and the vertical charge coupled device is decreased. Third, a dark current may reduce the signal-to-noise ratio because the signal may deteriorate as the area of the photodiode decreases.

A solid state imaging device has a photodiode array which photoelectrically converts incident light into electrical signals. Vertical and horizontal charge coupled devices transfer the electrical signals generated by the photodiode array, and an output circuit amplifies the output signal and converts the amplified signal to a voltage signal. The signal photoelectrically converted from the photodiode is transferred to the vertical charge coupled device during a vertical blanking interval and transmitted to the horizontal charge coupled device step by step during a horizontal blanking interval. The charge transmitted to the horizontal charge coupled device is transferred to a floating diffusion amplifier. This signal is photoelectrically converted from the photodiode and transmitted to the vertical charge coupled device through a transmission gate responsive to a gate bias signal of a field shift voltage.

Typically, the transmission gate is provided between the photodiode and the vertical charge coupled device. Before the field shift voltage is applied, the transmission gate is doped with a p-type dopant to form a potential barrier between the photodiode and the vertical charge coupled device. The transmission gate is doped with a sufficiently low dopant concentration to not form a hole accumulation layer. Because the silicon boundary of the transmission gate region does not have a hole accumulation layer, electrons generated from the silicon boundary may flow to the photodiode and to the vertical charge coupled device mixing with the signal charge thereby creating the dark current.

FIG. 1 illustrates a pixel structure for a solid state imaging device according to the prior art. This pixel structure includes a p-type well 12 having a low dopant concentration formed in an n-type substrate 10 having a low dopant concentration. An n-type well 14 of intermediate dopant concentration is formed on the p-type well 12, and a p-type well 16 of intermediate dopant concentration is formed on the n-type well 14 at a charge transfer region of the pixel. An n-type charge coupled region 22 having a relatively high dopant concentration is formed on the p-type well 16, and this n-type charge coupled region 22 provides a vertical charge coupled device (VCCD).

A gate insulation layer 24 is provided on the surface of the substrate 10, and the gate electrode 26 is formed on the charge transfer region of the substrate. An n-type photodiode region 18 is formed on the n-type well 14 at a light receiving region of the pixel, and this n-type photodiode region is self-aligned with the gate electrode layer 26. This n-type photodiode region provides an n-type photoelectric conversion region. A p-type channel stop region 19 having a relatively high dopant concentration and a p-type hole accumulation 20 having a high dopant concentration are formed. The gate electrode layer 26 is covered with an insulation layer 28, and a light shielding layer 30 is formed on the insulation layer 28. A passivation layer 32 is formed on the light shielding layer 30.

In the pixel structure illustrated in FIG. 1, a charge generated at the photoelectric conversion region 18 is transferred to the vertical charge coupled device region 22 through the surface channel of the p-type well 16 which provides the transmission gate region. Because the photoelectric conversion region 18 extends to the bottom edge of the gate electrode layer 26, the boundary between the silicon and the gate insulation layer is depleted and a boundary state is thus activated. A relatively large current can thus be generated. To reduce an after image, a thermal process can be used when forming the photoelectric conversion region 18 so as to be self-aligned with the gate electrode layer 26. The previously formed p-type well 16 and vertical charge coupled region 22, however, may be influenced by this thermal process, and it may thus be difficult to form a shallow junction. The capacitance per unit area may thus be reduced, and the maximum charge handling capability may also be reduced. Because there is a wide depletion region under the channel, the image smear may increase.

A method for reducing the disadvantages discussed above is discussed in the reference by Ozaki et al. entitled "High-Packing Pixel With Punchthrough Read-Out Method For An HDTV Interline CCD" (IEEE Trans. Electron Devices, Vol. 41, No. 7, July 1994, pp. 1128–1135), and illustrated in FIG. 2. As shown in FIG. 2, a p-type well 42 having a relatively low dopant concentration is formed in an n-type substrate 40 also having a relatively low dopant concentration. An n-type well 44 having a relatively low dopant concentration is formed on the p-type well 42, and an n-type well 46 having an intermediate dopant concentration is formed on the n-type well 44. An n-type photoelectric conversion region 48 is formed on the n-type well 46 at the light receiving region of the pixel.

A masking pattern defines a width L1 of a transmission gate region and a width L2 of a channel stop region. A p-type well 50 having an intermediate dopant concentration and an n-type vertical charge coupled region 54 having a relatively high dopant concentration are sequentially formed around the surface of the substrate through the masking pattern. A gate isolation layer 56 is deposited on the surface of the substrate, and a gate electrode layer 58 is then formed. A p-type hole accumulation layer 52 having a relatively high dopant concentration is formed, and this p-type hole accumulation layer 52 is self-aligned with the gate electrode layer 58. An insulation layer 60 is formed on the gate electrode layer 58, and a light shielding layer 62 is formed on the insulation layer 60.

The solid state imaging device having the punch through readout structure illustrated in FIG. 2 may, however, have shortcomings. First, the p-type well 50 around the vertical charge coupled device should be shallow to facilitate the signal transmission to the vertical charge coupled device 54 from the photoelectric conversion region 48. If a high voltage is applied to the substrate 40 to drive an electric shutter, however, the signal charge may be influenced because the charge which is being transmitted to the vertical charge coupled device flows to the substrate.

Second, it may difficult to uniformly adjust the thermal diffusion process used after the ion implantation when forming the p-type well 50. When forming the mask pattern which defines the width L1 of the transmission gate region and the width L2 of the channel stop region, a characteristic variation may occur due to misalignment. Third, if the width L2 of a channel stop region is not stably adjusted, the charge accumulated in the photoelectric conversion region horizontally adjacent to the vertical charge coupled device may flow to the vertical charge coupled device during a field shift such as during a readout. Fourth, because the aperture ratio of the pixel region is reduced as much as the transmission gate region, the sensitivity may be lowered.

SUMMARY OF THE INVENTION

It is therefore an object of the present invention to provide improved charge coupled devices and methods.

It is another object of the present invention to increase an aperture ratio of a light receiving region for charge coupled devices.

These and other objects are provided according to the present invention by charge coupled devices including a substrate, a photoelectric conversion region, a hole accumulation region, a vertical charge coupled region, and a buried transmission gate region. The substrate includes a surface with a light receiving region and a charge transmission region. The photoelectric conversion region is provided in the substrate beneath the light receiving and charge transmission regions of the substrate surface. In particular, the photoelectric conversion region generates a photoelectric signal responsive to light received at the light receiving region of the substrate surface.

The hole accumulation region is provided in the substrate between the photoelectric conversion region and the light receiving region of the substrate surface. The vertical charge coupled region is provided on the substrate between the photoelectric conversion region and the charge transmission region of the substrate surface. The buried transmission gate region is provided between the vertical charge coupled region and the photoelectric conversion region wherein the buried transmission gate region transfers the photoelectric signal from the photoelectric conversion region to a portion of the vertical charge coupled region opposite the substrate surface.

Furthermore, the buried transmission gate region may extend between the photoelectric conversion region and the hole accumulation region, and the hole accumulation region may also extend adjacent to the vertical charge coupled region separating the buried transmission gate region from the substrate surface. The hole accumulation region may extend adjacent to the vertical charge coupled region separating the photoelectric conversion region from the substrate surface.

In addition, the charge coupled device may include a gate electrode on the charge transmission region of the substrate surface adjacent the vertical charge coupled region. The hole accumulation region may thus extend adjacent to the vertical charge coupled region, and a boundary between the hole accumulation region and the vertical charge coupled region can be coincident with an edge of the gate electrode. Furthermore, the substrate, the photoelectric conversion region, and the vertical charge coupled region may have a first conductivity type, and the hole accumulation region and the buried transmission gate region may have a second conductivity type. In particular, the first conductivity type can be n-type, and the second conductivity type can be p-type.

The charge coupled devices of the present invention may thus be used to provide an imaging device which has a transmission region buried beneath a vertical charge coupled device. In particular, the charge coupled devices may have an increased aperture ratio of a light receiving region thus achieving a relatively high sensitivity. Accordingly, the resulting charge coupled solid state imaging devices can be used advantageously to drive an electric shutter.

DETAILED DESCRIPTION

Figure 1:
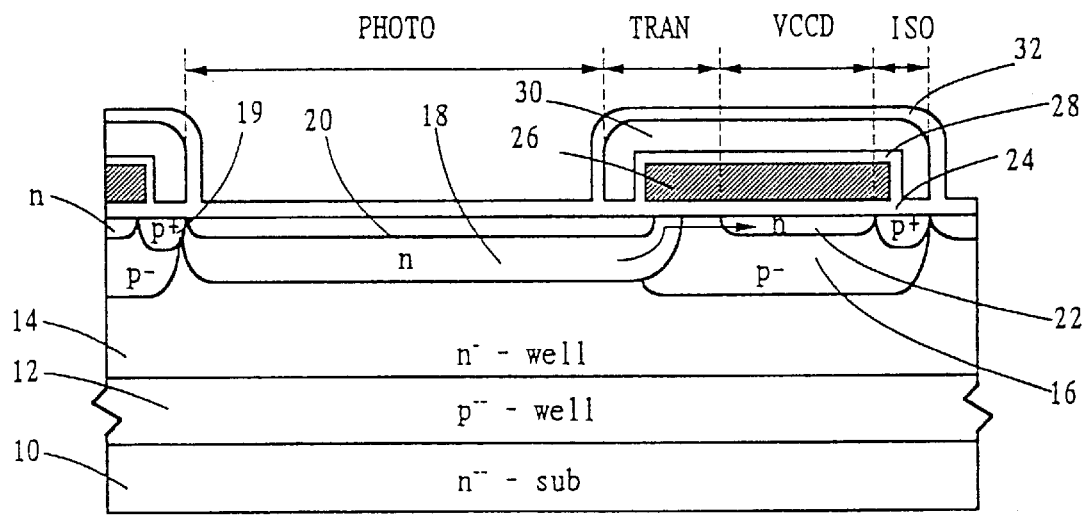
FIG. 1 is a cross-sectional view illustrating a pixel structure of a charge coupled solid state imaging device according to the prior art.
Figure 2:
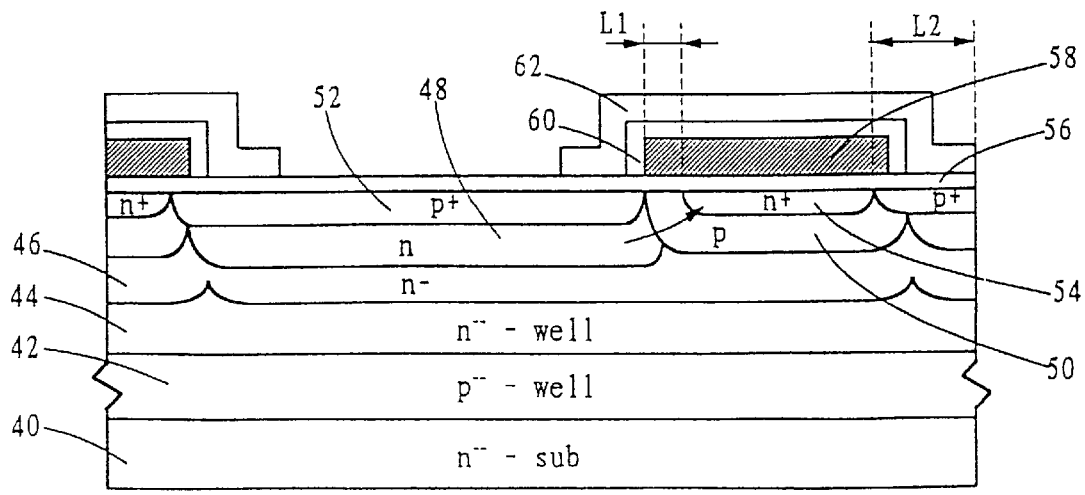
FIG. 2 is a cross-sectional view illustrating a pixel structure of a punch through charge coupled solid state imaging device according to the prior art.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Figure 3:
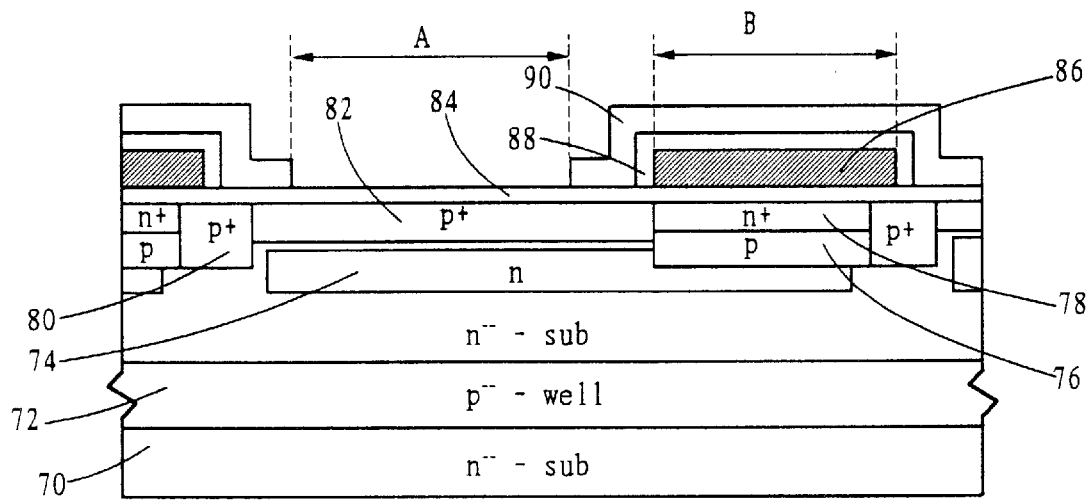
FIG. 3 is a cross-sectional view illustrating a pixel structure of a charge coupled solid state imaging device with a vertical transmission gate according to the present invention.

A cross-sectional view of a charge coupled device according to the present invention is illustrated in FIG. 3. The pixel structure includes a p+ hole accumulation region 82 formed on the surface of an n–– semiconductor substrate 70 at a light receiving region A thereof. An n+ vertical charge coupled region 78 is formed at the surface of the semiconductor substrate at the charge transmission region B, and an n-type photoelectric conversion region 74 is formed in the substrate beneath the hole accumulation region 82 and the vertical charge coupled region 78. A buried transmission gate region 76 is formed between the vertical charge coupled region 78 and the photoelectric conversion region 74.

The buried transmission gate region 76 transfers a signal charge generating at the photoelectric conversion region 74 to the bottom of the vertical charge coupled region 78 by punch through. A p– – buried layer 72 is formed in the substrate below the pixel regions.

A p+ channel stop region 80 is formed to electrically isolate the hole accumulation region 82 and the vertical charge coupled region 78 from adjacent pixel regions. Channel stop regions are not formed at the boundary of the vertical charge coupled region 78 vertically adjacent to each pixel region so as to transfer a charge, and the channel stop region is formed only at the other boundary to reduce an electrical contact with a channel of an adjacent pixel. The charge coupled device also includes a gate insulation layer 84, a gate electrode layer 86, an insulation layer 88, and a light shielding layer 90.

The pixel structure of FIG. 3 differs from that of the prior art in that a channel of a horizontal transmission gate is not provided between the hole accumulation region 82 and the vertical charge coupled region 78. The transmission gate region 76 is vertically formed between the vertical charge coupled region 78 and the photoelectric conversion region 74. In addition, the transmission gate region 76 may be formed beneath the entire pixel region rather than only at the bottom of the vertical charge coupled region 78, as shown in FIG. 4.

Figure 4:
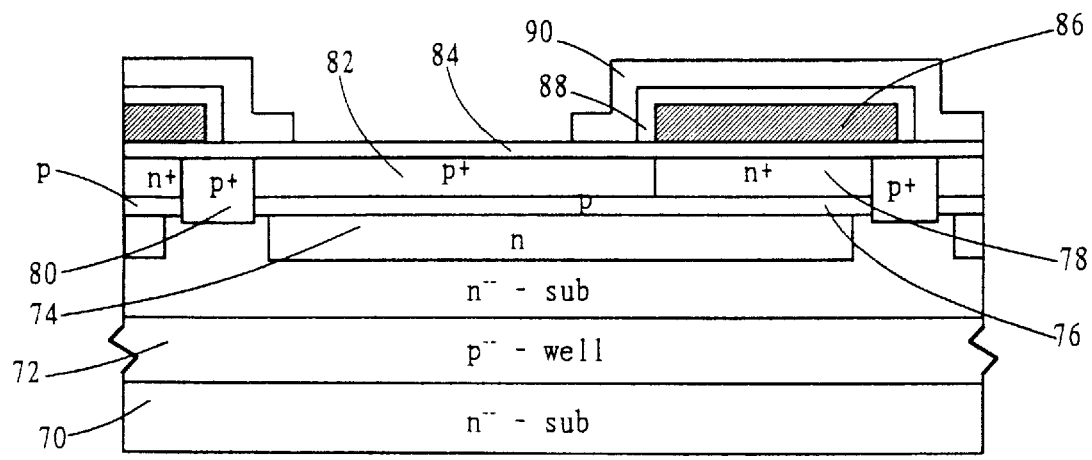
FIG. 4 is a cross-sectional view illustrating a pixel structure of a charge coupled solid state imaging device with a vertical transmission gate according to the present invention.

The pixel structures illustrated in FIGS. 3 and 4 thus have the following advantages when compared with pixel structures of the prior art. First, the size of the gate electrode layer 86 and the light shielding layer 90 can be reduced by eliminating the horizontal channel region of the transmission gate. The horizontal channel region of the prior art may increase the area occupied by the charge transmission region B thus reducing the aperture ratio of the pixel region. By eliminating the horizontal channel region, the aperture ratio of the pixel region can be increased and the signal sensitivity can also be increased. Second, because the photoelectric conversion region 74 can be enlarged beneath the charge transfer region B, an intermediate region caused by the conventional p-type well can be reduced, and a noise component of image smear flowing to the vertical charge coupled device from the intermediate region can be suppressed.

Third, because the conventional p-type well surrounding the vertical charge coupled device is not used, a rising affect of an overflow drain barrier can be reduced and the signal charge of a photoelectric conversion region 74 can be effectively ejected to the semiconductor substrate 70 when driving an electronic shutter thereby improving the function of the electronic shutter. Fourth, because the transmission gate region 76 and the vertical charge coupled region 78 can be formed using a single masking process, the number of masking steps can be reduced and the cost of production can thus be reduced.

Figure 5:
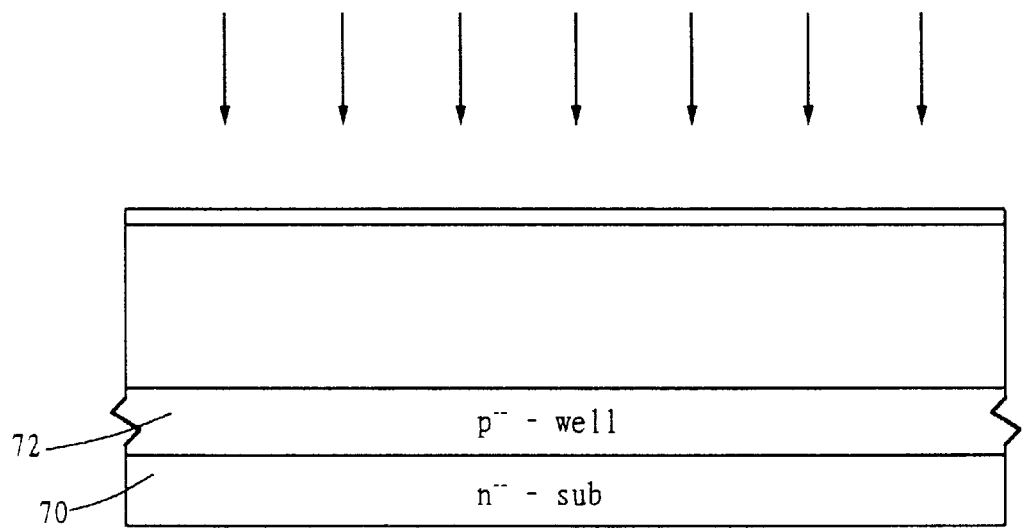
FIGS. 5–8 are cross-sectional views illustrating steps of a process for forming the charge coupled solid state imaging device of FIG. 3.
Figure 6:
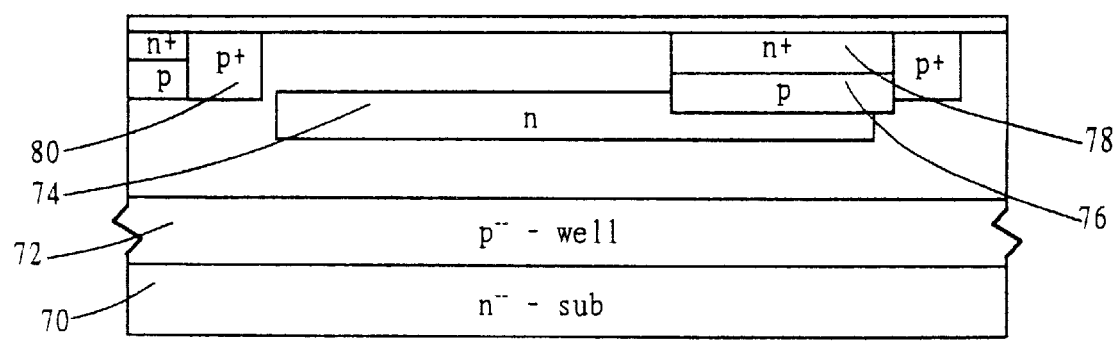

A method for forming the pixel structure of a charge coupled device according to the present invention is illustrated in FIGS. 5–8. As shown in FIG. 5, the p- - buried layer 72 is formed at a predetermined depth from the surface of the n-- substrate 70 by a high energy ion implantation. An ion implantation mask is then formed on the surface of the substrate 70, and the n-type photoelectric conversion region 74 of each pixel is formed between the surface of the semiconductor substrate and the buried layer 72 by ion implantation through the mask as shown in FIG. 6. Another mask pattern defines the charge transfer region B of each pixel region, and the p-type buried transmission gate region 76 is formed on the photoelectric conversion region 74 by high energy ion implantation through this mask pattern. The n+ vertical charge coupled region 78 is formed on the buried transmission gate region 76 using the same mask. A mask defining the channel stop region 80 is then formed, and the p+ channel stop region 80 is formed by ion implantation through this mask. The p+ channel stop region isolates each pixel region from adjacent pixel regions.

Figure 7:
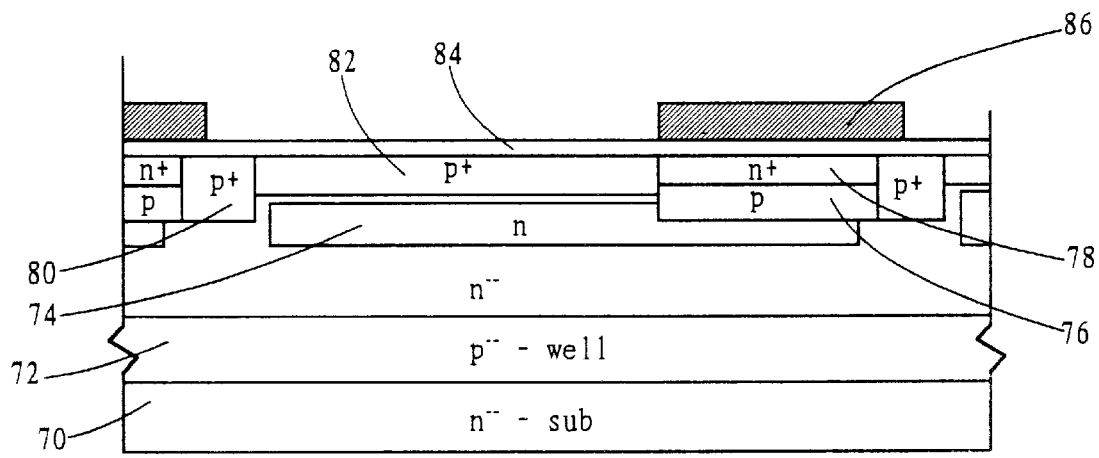

The gate insulation layer 84 is formed on the surface of the substrate 70 as shown in FIG. 7. A polysilicon layer is deposited on the gate insulation layer 84, and the polysilicon layer is selectively etched using photolithographic techniques to form the gate electrode 86 on the gate insulation layer 84 adjacent the vertical charge coupled region 78. By using the gate electrode 86 as an ion implantation mask, the p+ hole accumulation region 82 can be formed on the surface of the semiconductor substrate 70 so as to be self-aligned with the gate electrode layer 86.

Figure 8:
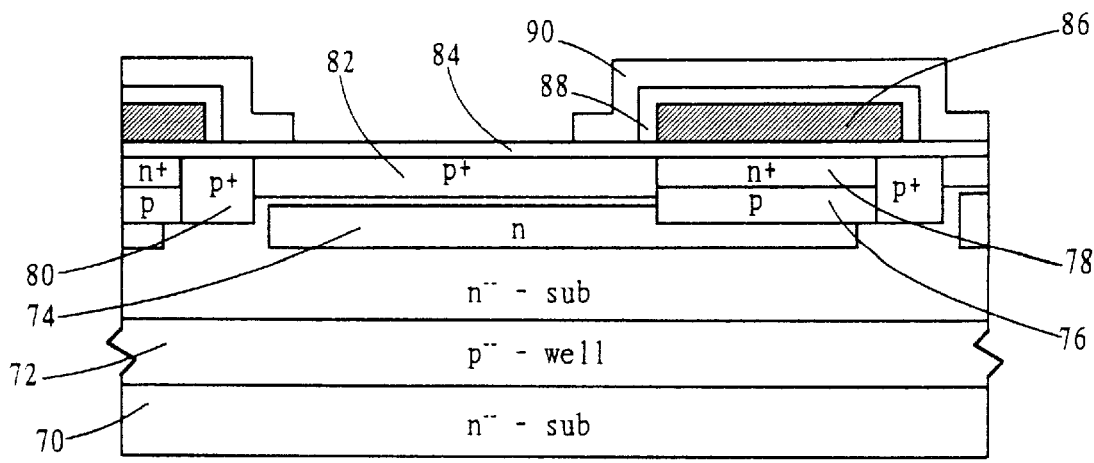

The gate electrode layer 86 is covered with the insulation layer 88, and a metal layer is deposited on the insulation layer 88. The metal layer is selectively etched by photo-lithographic techniques to form the light shielding layer 90 which defines an opening for each pixel region, as shown in FIG. 8. When forming the buried transmission gate region 76, the p-type dopant may alternately be implanted across the entire pixel region instead of just the charge transfer region. Accordingly, the number of masking steps required can be reduced. The p- - buried layer 72 can be formed by a double well of p- - dopant and n- - dopant as well as by the high energy ion implantation.

The method of forming the charge coupled device discussed above may have the following advantages when compared with prior art methods. First, the prior art methods may require a nitride layer pattern for determining the width L1 of the transmission gate region and the width L2 of the channel stop region. Because an accurate process control for ensuring a distance between the photoelectric conversion region and the vertical charge coupled region is needed, the process conditions needed to form the nitride pattern may be elaborate. Because the method of the present invention can be performed without the nitride layer pattern, however, the process of the present invention can be simplified.

Second, according to the methods of the prior art, the width of the p-type well of the diagonal direction positioned horizontally between the photoelectric conversion region and the vertical charge coupled region is determined by a thermal diffusion process when forming the p-type well and the n+ region. Accordingly, if uniformity of the thermal diffusion process is not maintained, differences in a punch through voltage may result. In the present invention, however, the process control is facilitated and the uniformity of the punch through voltage can be ensured because a distance between a photoelectric conversion region and the vertical charge coupled region is vertically adjusted. As discussed above, the process conditions are facilitated, and the productivity and the reliability can be ensured by controlling a fixed parameter of a vertical distance from the surface of the semiconductor substrate through the high energy ion implantation.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A charge coupled device comprising:

a substrate having a surface including a light receiving region and a charge transmission region;

a photoelectric conversion region in said substrate beneath said light receiving and charge transmission regions of said substrate surface wherein said photoelectric conversion region generates a photoelectric signal responsive to light received at said light receiving region of said substrate surface;

a hole accumulation region in said substrate between said photoelectric conversion region and said light receiving region of said substrate surface;

a vertical charge coupled region in said substrate between said photoelectric conversion region and said charge transmission region of said substrate surface wherein said hole accumulation region extends adjacent to said vertical charge coupled region; and a buried transmission gate region between said vertical charge coupled region and said photoelectric conversion region wherein said buried transmission gate region transfers said photoelectric signal from said photoelectric conversion region to a portion of said vertical charge coupled region.

2. A charge coupled device comprising:

a substrate having a surface including a light receiving region and a charge transmission region;

a photoelectric conversion region in said substrate beneath said light receiving and charge transmission regions of said substrate surface wherein said photoelectric conversion region generates a photoelectric signal responsive to light received at said light receiving region of said substrate surface;

a hole accumulation region in said substrate between said photoelectric conversion region and said light receiving region of said substrate surface;

a vertical charge coupled region in said substrate between said photoelectric conversion region and said charge transmission region of said substrate surface; and a buried transmission gate region between said vertical charge coupled region and said photoelectric conversion region wherein said buried transmission gate region transfers said photoelectric signal from said photoelectric conversion region to a portion of said vertical charge coupled region wherein said buried transmission gate region extends between said photoelectric conversion region and said hole accumulation region.

3. A charge coupled device according to claim 1 wherein said buried transmission gate region is separated from said substrate surface.

4. A charge coupled device according to claim 1 wherein said photoelectric conversion region is separated from said substrate surface.

5. A charge coupled device according to claim 1 further comprising a gate electrode on said charge transmission region of said substrate surface adjacent said vertical charge coupled region.

6. A charge coupled device according to claim 5 wherein a boundary between said hole accumulation region and vertical charge coupled region is coincident with an edge of said gate electrode.

7. A charge coupled device according to claim 1 wherein said substrate, said photoelectric conversion region, and said vertical charge coupled region are of a first conductivity type, and wherein said hole accumulation region and said buried transmission gate region are of a second conductivity type.

8. A charge coupled device according to claim 7 wherein said first conductivity type is n-type, and wherein said second conductivity type is p-type.

* * * * *